United States Patent
Charley et al.

(10) Patent No.: US 8,471,568 B2
(45) Date of Patent: Jun. 25, 2013

(54) EVALUATION OF A CHARGE IMPEDANCE AT THE OUTPUT OF A DIRECTIONAL COUPLER

(75) Inventors: Sylvain Charley, Mettray (FR); François Dupont, Tours (FR); Benoît Bonnet, Tours (FR)

(73) Assignee: STMicroelectronics (Tours) SAS, Tours (FR)

(*) Notice: Subject to any disclaimer, the term of this patent is extended or adjusted under 35 U.S.C. 154(b) by 299 days.

(21) Appl. No.: 12/960,303

(22) Filed: Dec. 3, 2010

(65) Prior Publication Data
US 2011/0199100 A1 Aug. 18, 2011

(30) Foreign Application Priority Data
Dec. 18, 2009 (FR) .................................. 09 59246

(51) Int. Cl.
*G01R 27/28* (2006.01)
*G01R 19/00* (2006.01)

(52) U.S. Cl.
USPC ........................................ 324/649; 324/76.11

(58) Field of Classification Search
USPC ............... 324/649, 600, 525, 632, 629, 126, 324/76.11, 128, 430; 455/318, 319, 320
See application file for complete search history.

(56) References Cited

U.S. PATENT DOCUMENTS

| | | | | |
|---|---|---|---|---|
| 5,642,254 | A | * | 6/1997 | Benwood et al. .............. 361/235 |
| 7,633,297 | B2 | * | 12/2009 | Ishii .............................. 324/430 |
| 2009/0253385 | A1 | | 10/2009 | Dent |
| 2010/0022203 | A1 | | 1/2010 | Bonnet et al. |

FOREIGN PATENT DOCUMENTS

JP 2007166534 A 6/2007

OTHER PUBLICATIONS

French Search Report dated Oct. 15, 2010 from corresponding French Application No. 09/59246.

* cited by examiner

*Primary Examiner* — Hoai-An D Nguyen
(74) *Attorney, Agent, or Firm* — Wolf, Greenfield & Sacks, P.C.

(57) ABSTRACT

A method and circuit for evaluating a charge impedance at the output of a directional coupling having a first line adapted to convey a desired signal between a first terminal and a second terminal adapted to be connected to an antenna, and having a second line coupled to the first one including a third terminal on the side of the first terminal and a fourth terminal on the side of the second terminal, wherein the signal present on the fourth terminal is submitted to a homodyne detector having its local oscillator signal sampled from the third terminal.

23 Claims, 2 Drawing Sheets

EVALUATION OF A CHARGE IMPEDANCE AT THE OUTPUT OF A DIRECTIONAL COUPLER

CROSS REFERENCE TO RELATED APPLICATIONS

This application claims the priority benefit of French patent application number 09/59246, filed on Dec. 18, 2009, entitled "Evaluation of a Charge Impedance at the Output of a Directional Coupler," which is hereby incorporated by reference to the maximum extent allowable by law.

BACKGROUND OF THE INVENTION

1. Field of the Invention

The present invention generally relates to electronic circuits and, more specifically, to radio frequency transceiver circuits.

The present invention more specifically applies to circuits equipped with a coupler for extracting data relative to the reflection loss on the antenna side and, more generally, relative to a charge impedance at the output of a directional coupler.

2. Discussion of the Related Art

Radio frequency transmit/receive chains generally integrate couplers. A coupler is used to sample part of the power present on a so-called main or primary transmission line towards another so-called coupled or secondary line, located nearby.

Couplers can be distributed in two categories according to whether they are formed of discrete passive components (lumped-element coupler) or of conductive lines which are close to each other to be coupled (distributed coupler). The present invention relates to the second category of couplers.

In many applications, it is needed to sample part of the power transmitted over a line, for example, to control the power of an amplifier in a transmit circuit, to control the linearity of a transmit amplifier according to the loss due to the reflection of an antenna, to dynamically match an antenna, etc. A coupler is used to sample this information.

More and more often, communicating electronic appliances (for example, cell phones or laptop computers) are capable of operating over different frequency ranges (for example, GSM and WLAN). They are then generally equipped with several antennas. Further, such transceiver circuits are capable of operating at the same time. Presently, the antennas are not perfectly isolated from one another. This results in a risk for an antenna to capture the transmissions of another frequency band with a non-negligible level with respect to the desired signal.

This poses a problem in the use of couplers. In particular, in the presence of a directional coupler generally having the function of measuring the reflection loss on the antenna side (and thus a possible mismatch), the level of the parasitic signal originating from another frequency band is capable of being greater than the level of the desired signal, thus corrupting the measurement.

To solve this problem, a current solution is to associate, with the secondary line of the coupler, demodulators of the signals present thereacross. Such a demodulation enables to remove the parasitic frequency band and to properly calculate the reflection loss. However, this demodulation has a high cost.

It would be desirable to improve the reliability of the measurements performed by a coupler at the lowest possible cost.

SUMMARY OF THE INVENTION

An object of an embodiment of the present invention is to overcome all or part of the disadvantages of usual radio frequency transceiver systems.

An object of an embodiment of the present invention more specifically is to improve the reliability of a directional coupler.

An object of an embodiment of the present invention is to do away with disturbances originating from transmissions in other frequency bands, especially on the measurement of the charge impedance at the output of a directional coupler.

An object of an embodiment of the present invention also is to avoid a demodulation of the signals measured by the usual receive circuits present in the radio frequency chain.

To achieve all or part of these and other objects, the present invention provides a circuit for evaluating a charge impedance at the output of a directional coupler having a first line adapted to convey a desired signal between a first terminal and a second terminal adapted to be connected to an antenna, and having a second line coupled to the first one comprising a third terminal on the side of the first terminal and a fourth terminal on the side of the second terminal, the circuit comprising:

a first input terminal adapted to be connected to said third terminal of the coupler;

a second input terminal adapted to be connected to the fourth terminal of the coupler;

a homodyne detector having a first input for a signal to be processed connected to said second input terminal and having a second local oscillator input connected to said first input terminal;

a first low-pass filter having an input connected to a first output of the homodyne detector and providing first data relative to the charge impedance; and a second low-pass filter having an input connected to a second output of the homodyne detector and providing second data relative to the charge impedance.

According to an embodiment of the present invention, a first variable-gain amplifier is coupled between said second input terminal of the circuit and said first input of the homodyne detector, the gain being set according to the signal level received on said first input of the circuit.

According to an embodiment of the present invention, a logarithmic detector is coupled between said first input terminal of the circuit and said second input of the homodyne detector, an output of said detector being connected to a gain control input of said amplifier.

According to an embodiment of the present invention, the homodyne detector comprises:

a first multiplier having two inputs respectively connected to the first and second inputs of the detector, and having an output connected to the first output of the detector providing said first data; and a second multiplier having two inputs respectively connected directly to the first input of the detector and, via a 90° phase shifter, to the second input of the detector, and having an output connected to the second output of the detector.

According to an embodiment of the present invention, third data relative to the amplitude of the charge impedance are obtained by calculating the square root of the sum of the squarings of the first and second data.

According to an embodiment of the present invention, fourth data relative to the phase of the charge impedance are obtained by calculating the arc tangent of the ratio of the second data to the first data.

The present invention also provides a radio frequency transceiver circuit comprising:

a directional coupler having a first line adapted to convey a desired signal between a first terminal and a second terminal adapted to be connected to an antenna, and having a second line coupled to the first one comprising a third terminal on the side of the first terminal and a fourth terminal on the side of the second terminal; and a circuit for evaluating a charge impedance at the output of the directional coupler, the first and second input terminals of the circuit being respectively connected to the third and fourth terminals of the coupler.

At least one embodiment of the present invention also provides a method for evaluating a charge impedance at the output of a directional coupler having a first line adapted to convey a desired signal between a first terminal and a second terminal adapted to be connected to an antenna, and having a second line coupled to the first one comprising a third terminal on the side of the first terminal and a fourth terminal on the side of the second terminal, wherein:

the signal present on the fourth terminal is submitted to a homodyne detector having its local oscillator signal sampled from the third terminal.

According to an embodiment of the present invention:

the signal present on the fourth terminal is multiplied by the signal present on the third terminal, then submitted to a low-pass filtering to provide first data relative to the charge impedance; and the signal present on the third terminal is phase-shifted by 90°, then multiplied by the signal present on the fourth terminal, the result of the multiplication being submitted to a low-pass filtering to provide second data relative to the charge impedance.

The foregoing objects, features, and advantages of the present invention will be discussed in detail in the following non-limiting description of specific embodiments in connection with the accompanying drawings.

DETAILED DESCRIPTION

Figure 1:
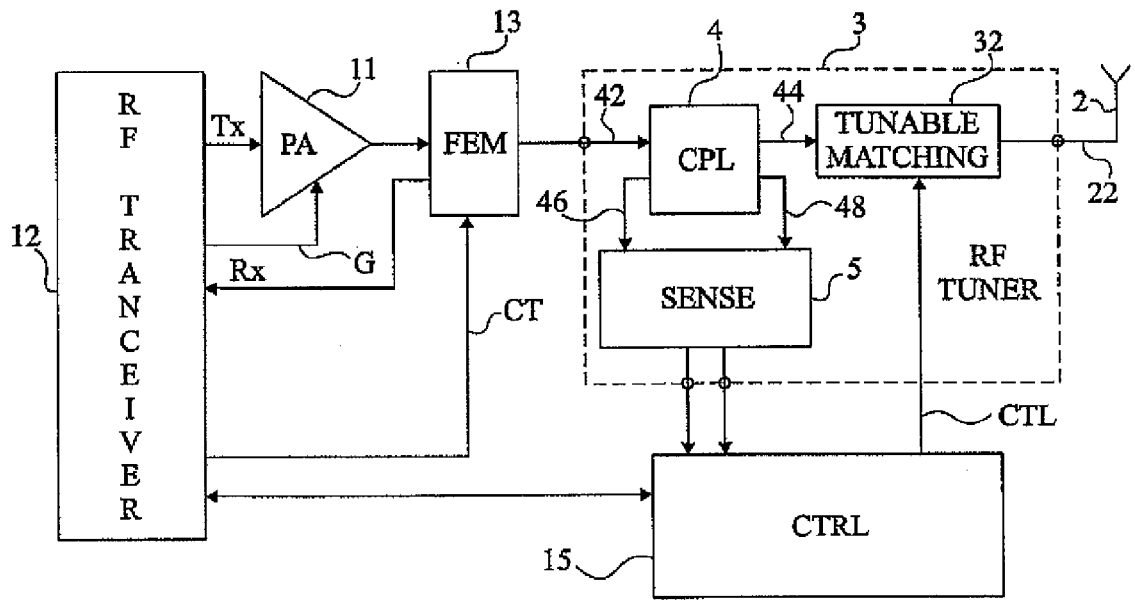
FIG. 1 is a block diagram of an embodiment of a radio frequency transceiver circuit.

The same elements have been designated with the same reference numerals in the different drawings. For clarity, only those elements which are useful to the understanding of the present invention have been shown and will be described. In particular, the generation and the exploitation of the signals transmitted and received by the radio frequency transceiver circuit have not been detailed, the present invention being compatible with usual processings. Further, what exploitation is made of the measurements of the charge impedance on the antenna side has not been detailed, the present invention being here again compatible with current uses of these data, be it to match the power of a transmit amplifier, to set an impedance matching network, etc.

FIG. 1 is a block diagram of an example of the forming of a radio frequency transceiver circuit of the type to which the present invention applies.

This circuit is adapted to operate in a given frequency range, for example, one of the GSM communication bands. A transmit amplifier 11 receives, from an electronic processing circuit 12 (RF TRANSCEIVER), a signal Tx to be transmitted. This signal, amplified by amplifier 11, is adapted to be applied on a terminal 22 of an antenna 2 after having crossed a processing chain. In the example of FIG. 1, this chain comprises a front end module 13 (FEM) and a radio frequency tuner 3 (RF TUNER). Module 13 forms an antenna switch and has the function of separating the transmitted signals from the signals received by the antenna. Module 13 provides circuit 12 with a received signal Rx. Further, module 13 receives one or several control signals CT from circuit 12.

Tuner 3 comprises, among others, a coupler 4 (CPL) and an impedance matching circuit 32 (TUNABLE MATCHING) in charge of matching the impedance of antenna 2 in real time according to the disturbances likely to be present.

Coupler 4 is in charge of restoring, on secondary terminals 46 and 48 of a secondary line, data proportional to the signals transiting over a main line having terminals 42 and 44 respectively connected to the output of module 13 and to the input of matching network 32. Terminals 46 and 48 of the secondary line are connected to a sensing circuit 5 (SENSE) intended, in this example, to provide data relative to the reflection loss on the side of antenna 2 to a control circuit 15 (CTRL) of impedance matching network 32. Circuit 15 exchanges data with circuit 12 and provides a control signal CTL to network 32. The data extracted from the secondary line of coupler 4 may also be used to control an antenna with a settable impedance or, via circuit 12, gain G in transmit amplifier 11.

The respective positions of tuner 3 and of antenna switch 13 may be inverted. In this case, two tuners are present, respectively for the transmission and for the reception.

Further, other circuits are likely to equip a radio frequency transceiver circuit such as illustrated in FIG. 1, for example, filters, other couplers, or other impedance matching elements. Moreover, the connections between the different elements have been shown as single wire connections for simplification. Several signals may however transit between the different elements, for example, to convey other data or controls, or to convey differential signals.

Figure 2:
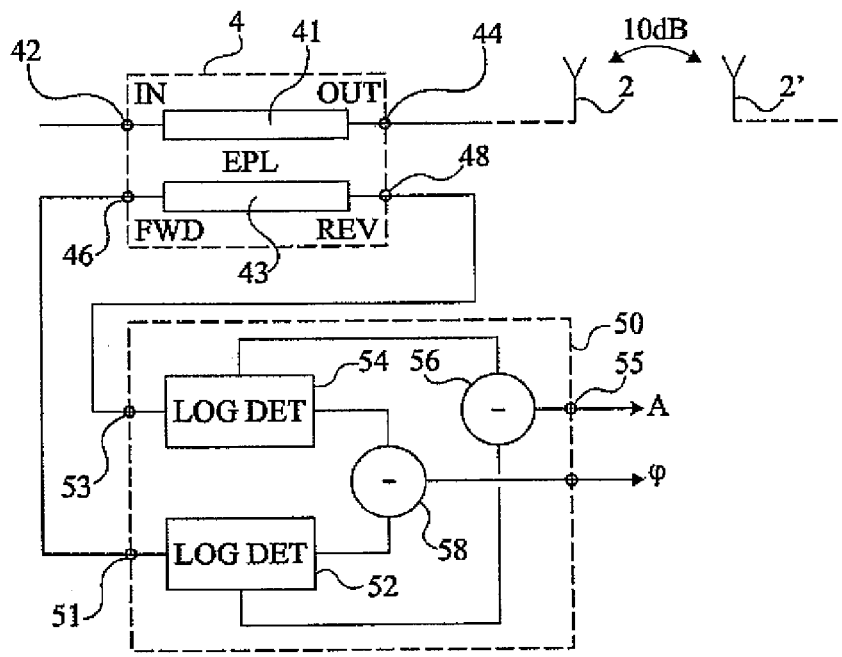
FIG. 2 very schematically shows a coupler associated with a usual detection circuit.

FIG. 2 schematically shows coupler 4 of the RF tuner of FIG. 1 associated with a usual detection circuit 50. The other elements of the circuit of FIG. 1 have not been illustrated in FIG. 2.

Coupler 4 for example is a distributed coupler and comprises a main line 41 having ends defining terminals 42 and 44 (generally designated as IN and OUT). Line 41 is coupled to a secondary line 43 having ends FWD (or CPLD) and REV (or ISO) respectively facing ends IN and OUT, defining terminals 46 and 48. Secondary line 43 samples part of the power transiting over main line 41 for measurement purposes. The proportion of the sampled power defines the coupling (generally between 20 and 40 dB).

The main parameters of a coupler are:

the insertion loss, which corresponds to the transmission loss between the two accesses of a main line (the insertion loss is defined while the two other ports of the coupler are loaded with a 50-ohm impedance);

the coupling, which corresponds to the transmission loss between ports IN and CPLD (the coupling is then defined while the two other ports OUT and ISO are loaded with a 50-ohm impedance);

the isolation, which corresponds to the transmission loss between portions IN and ISO (the isolation is defined while the two other ports OUT and CPLD are loaded with a 50-ohm impedance); and the directivity, which corresponds to the transmission loss difference between ports ISO and CPLD, from port IN.

The directivity thus corresponds to the power difference (expressed in dB) between the two accesses of the coupled or secondary line. An ideal coupler has an infinite directivity, that is, no power is present on the port of its secondary line located in front of output port OUT of its main line when a signal flows over this main line from input port IN to output port OUT. In practice, a coupler is said to be directional when its directivity is sufficient for the powers recovered from the ports of its secondary line to enable to distinguish the direction in which the power flows in the main line.

The embodiments which will now be descried relate to directional couplers in which the signals present on terminals CPLD and ISO do not have the same levels. If these couplers are symmetrical, they are then bidirectional, that is, in the same way as a signal applied on terminal IN is coupled on terminal FWD (CPLD), a signal applied on terminal OUT is coupled at the level of terminal REV (ISO).

Assuming that the coupler is supplied with a signal to be transmitted on terminal IN, the most part of this signal is transmitted to antenna 2. A small part of the signal (having its power depending on the coupling) arrives on terminal FWD. A coupler is considered as having a good directivity if said directivity is at least 20 dB. With a coupling of approximately −30 dB (which corresponds to sampling $\frac{1}{1000}$ of the transmitted power), the isolation then is on the order of −50 dB, which is acceptable and a negligible portion of the transmitted signal arrives on terminal REV. To simplify the following discussion, the coupler is assumed to have an infinite directivity.

In the example of FIG. 2, the reflection loss on the side of antenna 2, that is, the proportion of the transmitted signal which is reflected by the antenna, is desired to be assessed. For this purpose, the difference between the amplitude of the signal present on terminal FWD and the amplitude of the signal present on terminal REV, which is proportional to the amplitude of the signal returned by the antenna is measured. The coupling conditions the amplitude of the signal present on terminal REV with respect to the amplitude reflected by the antenna on terminal OUT.

Detection circuit 50 comprises two input terminals 51 and 53 respectively connected to terminals 46 and 48 and is in charge of calculating the amplitude difference, and sometimes the phase difference, between the signals present on terminals FWD and REV. Typically, circuit 50 comprises two logarithmic detectors 52 and 54 (LOG DET) determining the amplitude of the signals present on terminals 51 and 53. The measured amplitudes are subtracted from each other (more specifically, the amplitude provided by detector 54 is subtracted from that provided by detector 52) to obtain amplitude A of the reflection loss on an output terminal 55 of circuit 50. Optionally, phase φ of the reflected signal with respect to the transmitted signal is also calculated by a subtractor 58 exploiting a phase information provided by detectors 52 and 54. The dynamics of logarithmic detectors depends on the amplitude of the expected signals. Logarithmic detectors having dynamics from 40 to 60 dB are generally used.

Taking as an example a coupler 4 having an infinite directivity and a −30 dB coupling, a signal applied on terminal IN will be transmitted on terminal OUT (with a neglected attenuation corresponding to the insertion loss). Assuming a −10 dB reflection loss, a +15 dBm signal applied on terminal IN is transmitted to the antenna and terminal OUT sees the return of a reflected signal with a +5-dBm level. On the secondary line side, due to the coupling, the signal present on terminal FWD has a −15-dBm amplitude. It is for example assumed that the coupler is symmetrical so that the coupling between terminals OUT and REV is identical to the coupling between terminals IN and FWD. Accordingly, the signal present on terminal REV has a −25-dBm amplitude. Calculating the difference between the amplitudes present on terminals FWD and REV effectively provides the information about the reflection loss, that is, −10 dB.

However, under certain circumstances, the signal present on terminal OUT may be influenced by other parameters than the reflection loss of the antenna. Such is especially the case if antenna 2 detects a signal originating from another transmit path. Now, mobile communication devices are more and more often capable of communicating over several frequency bands and thus have several antennas which may additionally transmit simultaneously. For example, the equipment comprises another transceiver circuit associated with an antenna 2' (for simplification, the rest of the transmit circuit has not been illustrated in FIG. 2). The influence of one circuit on the other then depends on the isolation between antennas. Presently, this isolation is never perfect. As a result, when the transmit circuit associated with antenna 2' operates at the same time as that associated with antenna 2, the latter detects signals originating from the other frequency band. Even when attenuated by the isolation between antennas, these signals are likely to disturb the measurement of the reflection loss by detector 50. Assuming that there is a 10-dB isolation between antennas 2 and 2', and that antenna 2' receives a +20-dBm level from its transmit circuit, antenna 2 detects a parasitic signal with a +10-dBm level. With the previous coupling and directivity values, the signal will have a −20-dBm level on terminal REV (−30-dB coupling). This parasitic signal thus has an amplitude greater than that (−25 dBm) of the desired signal on measurement of the reflection loss on terminal REV. This results in an erroneous measurement, detector 50 then estimating the reflection loss as −5 dB while it is −10 dB. This results in a mismatch of the antenna and in an alteration of the communication.

This problem is particularly present for mobile communication devices integrating several circuits capable of operating at different frequencies or when two mobile communication devices are very close to each other (for example, a mobile phone placed close to a communicating laptop computer). Such conditions may generally be present so that the amplitude of the parasitic signal is greater than that of the desired signal. Indeed, if these are surrounding signals (transmitted from a distant source), they generally have a much lower level.

It could have been devised to filter the signal present on terminal REV to remove the component due to the unwanted frequency band. However, the parasitic signals may be in a band close to that of the desired signal, requiring acoustic filters (SAW or BAW) due to the significant required attenuation. Here again, this would result in an expensive and bulky solution.

Figure 3:
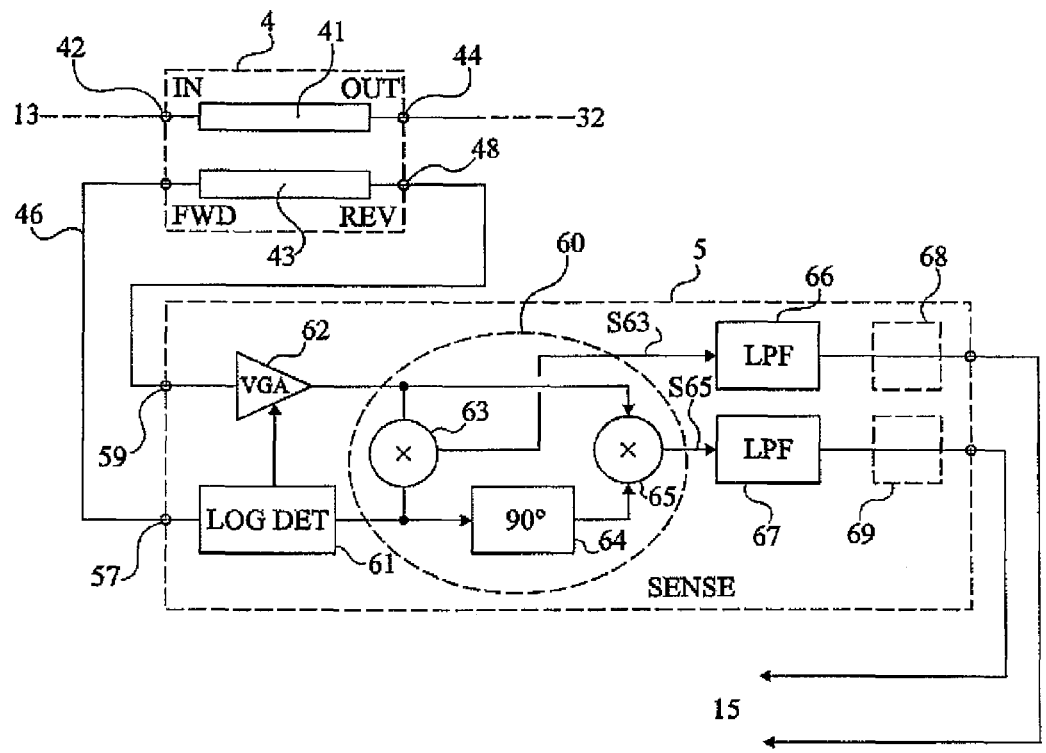
FIG. 3 very schematically shows a coupler associated with a detection circuit according to an embodiment of the present invention.

FIG. 3 shows an embodiment of a detection circuit 5 associated with a coupler 4 for extracting amplitude and optionally phase data from the reflection loss. The other elements of the transceiver circuit have not been illustrated in FIG. 5 and are, for example, identical to those of FIG. 1.

Detector 5 is based on a homodyne detector or receiver 60, that is, using a demodulation based on a local oscillator at same frequency as the signal to be measured to extract the amplitude and phase data. Such a detector is also called a detector with a zero intermediary frequency. According to this embodiment, advantage is taken from the presence, on terminal 46 of the coupler, of a signal in the desired frequency band which is desired to be detected on the side of terminal REV, to use it as a local oscillator frequency of the homodyne detector.

It could have been devised to use as a local oscillator a frequency originating from the transmit circuit (12, FIG. 1). However, the frequency used by the transmit circuit should remain as clean (undisturbed) as possible to enable a correct modulation of the signal to be transmitted. This frequency would risk being disturbed if it was conveyed all the way to tuner 3. In particular, the distance between transmit circuit 12 and tuner 3 is generally not negligible (on the same order of magnitude as the wavelength of the desired signal). As a result, on the tuner side, the local oscillator of the radio transmitter is not available.

In the embodiment of FIG. 3, terminal 46 of coupler 4 is connected to a first terminal 57 of the detector, connected to the input of a logarithmic detector 61. Terminal 48 of the coupler is connected to a second input terminal 59 connected to the input of an amplifier 62. Preferably, this amplifier is a variable-gain amplifier (VGA), controlled by logarithmic detector 61 according to the amplitude received on terminal 57, to normalize the measurement and extend the receive dynamics.

The signals provided by logarithmic detector 61 and amplifier 62 are processed by homodyne detector 60. A first multiplier 63 multiplies the signals delivered by detector 61 and by amplifier 62 and provides first data S63. Further, the output of detector 61 crosses a 90° phase-shifting element 64 having its output multiplied (multiplier 65) by the output of amplifier 62 to provide second data S65. As compared with a usual homodyne detector, a difference is to use the signal present on terminal FWD as a local oscillator.

The multiplication of the signal present on terminal REV by the desired signal takes back to the baseband the portion reflected by the antenna which corresponds to the transmission by circuit 12. The signals received by the antenna in other bands have their frequency shifted by the value of the local oscillator frequency. In practice, since the signal is modulated, this shifting suffers from the inaccuracy linked to the modulation range. This effect is however negligible as compared with the interval between frequency bands.

Detector 5 further comprises two low-pass filters 66 and 67 adapted to remove the contribution of the signals of parasitic frequency bands. Using a homodyne detector enables to take the desired signals back to the baseband, which eases the filtering. The signals provided by filters 66 and 67 are exploited by the control circuit (15, FIG. 1).

Figure 4A:
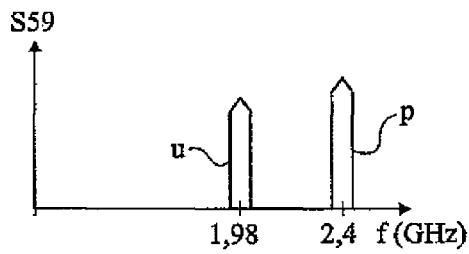
FIGS. 4A, 4B, and 4C illustrate the operation of the detection circuit of FIG. 3.
Figure 4B:
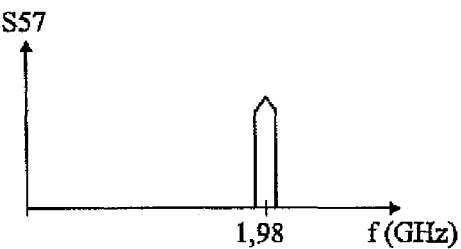
Figure 4C:
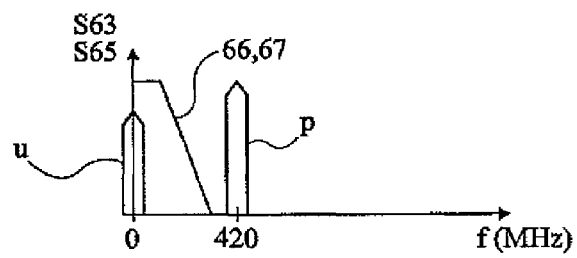

FIGS. 4A, 4B, and 4C illustrate the operation of detector 5 of FIG. 3. FIGS. 4A and 4B illustrate the frequency distribution of signals S57 and S59 present on input terminals 57 and 59 of the detector. FIG. 4C illustrates the frequency distribution at output S63 or S65 of homodyne detector 60.

It is assumed that the transceiver circuit associated with detector 5 is adapted to convey WCDMA mobile telephony signals (for example, around a 1.98-GHz frequency) and that the disturbances originate from an antenna transmitting in the WLAN frequency range (around 2.4 GHz). As illustrated in FIG. 4A, the signal present on terminal 59 comprises a desired portion u around 1.98 GHz and a parasitic portion p around 2.4 GHz. FIG. 4A shows that the level of portion p around 2.4 GHz is greater than that of desired portion u.

The signal present on terminal 57 (FIG. 4B) is only around the 1.98-GHz frequency.

FIG. 4C illustrates the frequency distribution of signals S63 and S65. Desired portion u is in the baseband (around 0 Hz), while parasitic portion p is brought around 420 MHz (2.4 GHz-1.98 GHz).

The modulation around central frequencies 1.98 and 2.4 is not disturbing since the modulation range is limited (typically from a few to a few tens of MHz). The signal portions thus do not overlap.

The cut-off frequency of filters 66 and 67 is selected according to the frequencies capable of disturbing the desired signal. In any event, the fact of having taken the desired signals back to the baseband considerably decreases the cut-off frequency and thus eases the forming of the filters, for example, with passive components.

The function of amplifier 62 is to normalize the amplitudes and to extend the demodulation dynamics of the two paths according to the amplitude on terminal 57.

With the following notations:

$\omega_u$ for the frequency of the desired signal;
$A_f$ for the amplitude of the desired signal present on terminal FWD;
$\omega_p$ for the frequency of the parasitic signal;
$A_p$ for the amplitude of this parasitic signal;
$A_r$ for the amplitude of the signal present on terminal REV at frequency $\omega_u$;
$\phi_r$ for the phase of the desired signal on terminal REV;
$\phi_p$ for the phase of the parasitic signal on terminal REV;
G1 for the gain of amplifier 62, preferably set based on the amplitude detected by detector 61; and
G2 for the gain of logarithmic detector 61, set on manufacturing;
the following relations may be established:

$$S57 = A_f * \cos(\omega_u t);$$

$$S59 = A_r * \cos(\omega_u t + \phi_r) + A_p * \cos(\omega_p t + \phi_p);$$

$$S62 = A_r * G1 * \cos(\omega_u t + \phi_r) + A_p * G1 * \cos(\omega_p t + \phi_p);$$

$$S61 = A_f * G2 \cos(\omega_u t);$$

$$S65 = A_f * G2 \sin(\omega_u t);$$

$$S66 = A_r * G1 * A_f * G2 * \cos(\phi_r);  \text{and}$$

$$S67 = A_r * G1 * A_f * G2 * \sin(\phi_r).$$

Data S66 and S67 provided by filters 66 and 67 enable to deduce the amplitude and the phase of the signal reflected in the frequency band exploited by the coupler. This amplitude and this phase may be calculated by circuit 15 or, as a variation, by calculation elements 68 and 69 illustrated in dotted lines in FIG. 3.

Amplitude $A_r$ is provided by the following relation:

$$A_r = \sqrt{(S66^2 + S67^2)}.$$

Phase $\phi_r$ is provided by the following relation:

$$\phi_r = \arctan(S67/S66).$$

It should be noted that the measured amplitude is independent from the phase difference. There however remains an ambiguity as to the phase-shift direction. This ambiguity is not disturbing in the aimed applications.

The above-described detector is compatible with other frequency bands even below the desired band. For example, if another antenna transmits around a GSM frequency at 900 MHz and the desired band is around 1.98 GHz, an aliasing of these frequencies around 900 MHz, which will be around 900 MHz at the output of the homodyne detector and can then be filtered, will be observed.

Further, the described detector is capable of eliminating the contributions of several parasitic bands, provided for these bands not to overlap the modulation of the desired band.

Various embodiments have been described, various alterations and modifications will occur to those skilled in the art. In particular, the practical forming of the detector is within the abilities of those skilled in the art based on the functional indications provided hereabove and on the desired and parasitic frequency ranges. Further, although the present invention has been described in relation with an example of a symmetrical directional distributed coupler, it more generally applies to any directional coupler, whether or not it is symmetrical and distributed or with lumped elements.

Such alterations, modifications, and improvements are adapted to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for evaluating a charge impedance at the output of a directional coupler having a first line adapted to convey a desired signal between a first terminal and a second terminal adapted to be connected to an antenna, and having a second line coupled to the first line, the second line comprising a third terminal on the side of the first terminal and a fourth terminal on the side of the second terminal, the circuit comprising:
   a first input terminal adapted to be connected to said third terminal of the coupler;
   a second input terminal adapted to be connected to the fourth terminal of the coupler;
   a homodyne detector having a first input for a signal to be processed connected to said second input terminal and having a second local oscillator input connected to said first input terminal, wherein the homodyne detector derives its local oscillator input from the third terminal of the directional coupler;
   a first low-pass filter having an input connected to a first output of the homodyne detector and providing first data relative to the charge impedance; and
   a second low-pass filter having an input connected to a second output of the homodyne detector and providing second data relative to the charge impedance.

2. The circuit of claim 1, wherein a first variable-gain amplifier is coupled between said second input terminal of the circuit and said first input of the homodyne detector, the gain being set according to the signal level received on said first input of the circuit.

3. The circuit of claim 2, wherein a logarithmic detector is coupled between said first input terminal of the circuit and said second input of the homodyne detector, an output of said detector being connected to a gain control input of said amplifier.

4. The circuit of claim 3, wherein the homodyne detector comprises:
   a first multiplier having two inputs respectively connected to the first and second inputs of the detector, and having an output connected to the first output of the detector providing said first data; and
   a second multiplier having two inputs respectively connected directly to the first input of the detector and, via a 90° phase shifter, to the second input of the detector, and having an output connected to the second output of the detector.

5. The circuit of claim 4, wherein third data relative to the amplitude of the charge impedance are obtained by calculating the square root of the sum of the squares of the first and second data.

6. The circuit of claim 5, wherein fourth data relative to the phase of the charge impedance are obtained by calculating the arc tangent of the ratio of the second data to the first data.

7. A radio frequency transceiver circuit comprising:
   a directional coupler having a first line adapted to convey a desired signal between a first terminal and a second terminal adapted to be connected to an antenna, and having a second line coupled to the first line, the second line comprising a third terminal on the side of the first terminal and a fourth terminal on the side of the second terminal; and
   a circuit for evaluating a charge impedance at the output of the directional coupler of claim 1, the first and second input terminals of the circuit being respectively connected to the third and fourth terminals of the coupler.

8. A method for evaluating a charge impedance at the output of a directional coupler having a first line adapted to convey a desired signal between a first terminal and a second terminal adapted to be connected to an antenna, and having a second line coupled to the first line, the second line comprising a third terminal on the side of the first terminal and a fourth terminal on the side of the second terminal, comprising:
   supplying a signal present on the fourth terminal of the directional coupler to a first input of a homodyne detector;
   supplying a signal present on the third terminal of the directional coupler to a local oscillator input of the homodyne detector; and
   processing outputs of the homodyne detector to evaluate the charge impedance at the output of the directional coupler.

9. The method of claim 8, further comprising:
   multiplying, by the homodyne detector, the signal present on the fourth terminal by the signal present on the third terminal to obtain a first result;
   low-pass filtering the first result to provide first data relative to the charge impedance;
   phase shifting, by the homodyne detector, the signal present on the third terminal by 90° to obtain a phase-shifted signal;
   multiplying, by the homodyne detector, the phase-shifted signal by the signal present on the fourth terminal to obtain a second result; and
   low-pass filtering the second result to provide second data relative to the charge impedance.

10. A radio frequency circuit comprising:
    a directional coupler having a main line configured to carry a signal between a first port and a second port, and a secondary line coupled to the main line, the secondary line having a third port associated with the first port and a fourth port associated with the second port; and
    a detection circuit comprising:
       a homodyne detector having a first input coupled to the fourth port of the directional coupler and a second input coupled to the third port of the directional coupler;
       a first low-pass filter having an input coupled to a first output of the homodyne detector and providing first data; and a second low-pas filter having an input coupled to a second output of the homodyne detector and providing second data.

11. A radio frequency circuit as defined in claim 10, wherein the homodyne detector comprises a first multiplier having inputs coupled to the first and second inputs of the homodyne detector, respectively, and providing the first output of the homodyne detector, a 90° phase shifter having an input coupled to the second input of the homodyne detector and providing a phase shifter output, and a second multiplier having two inputs respectively coupled to the first input of the homodyne detector and the phase shifter output, and providing the second output of the homodyne detector.

12. A radio frequency circuit as defined in claim 10, wherein the detection circuit further comprises a variable gain amplifier coupled between the fourth port of the directional coupler and the first input of the homodyne detector, wherein a gain of the variable gain amplifier is based on a signal level at the third port of the directional coupler.

13. A radio frequency circuit as defined in claim 12, wherein the detection circuit further comprises a logarithmic detector coupled between the third port of the directional coupler and the second input of the homodyne detector.

14. A radio frequency circuit as defined in claim 13, wherein the logarithmic detector is configured to control the gain of the variable gain amplifier.

15. A radio frequency circuit as defined in claim 10, further comprising a first calculation element configured to calculate an amplitude of a charge impedance at the output of the directional coupler by calculating the square root of the sum of the squares of the first and second data.

16. A radio frequency circuit as defined in claim 15, further comprising a second calculation element configured to calculate the phase of the charge impedance at the output of the directional coupler by calculating the arc tangent of the ratio of the second data to the first data.

17. A radio frequency circuit as defined in claim 10, wherein the first and second data represent the amplitude and phase of a reflected signal, at the output of the directional coupler, in a desired frequency band.

18. A method for evaluating a directional coupler having a main line configured to carry a signal between a first port and a second port, and a secondary line coupled to the main line, the secondary line having a third port associated with the first port and a fourth port associated with the second port, comprising:
coupling a first input of a homodyne detector to the fourth port of the directional coupler;
coupling a second input of the homodyne detector to the third port of the directional coupler;
low-pass filtering a first output of the homodyne detector and providing first data;
low-pass filtering a second output of the homodyne detector and providing second data; and
processing the first and second data to evaluate a charge impedance at the output of the directional coupler.

19. A method for evaluating a directional coupler as defined in claim 18, wherein coupling the first input of the homodyne detector to the fourth port of the directional coupler comprises coupling the fourth port of the directional coupler through a variable gain amplifier to the first input of the homodyne detector, and controlling the gain of the variable gain amplifier based on a signal level at the third port of the directional coupler.

20. A method for evaluating a directional coupler as defined in claim 19, wherein coupling the second input of the homodyne detector to the third port of the directional coupler comprises coupling the third port of the directional coupler through a logarithmic detector to the second input of the homodyne detector.

21. A method for evaluating a directional coupler as defined in claim 20, further comprising the logarithmic detector controlling the gain of the variable gain amplifier.

22. A method for evaluating a directional coupler as defined in claim 18, wherein processing the first and second data comprises determining the amplitude of the charge impedance at the output of the directional coupler by calculating the square root of the sum of the squares of the first and second data.

23. A method for evaluating a directional coupler as defined in claim 22, wherein processing the first and second data further comprises determining the phase of the charge impedance at the output of the directional coupler by calculating the arc tangent of the ratio of the second data to the first data.

* * * * *